United States Patent [19]

Hirao et al.

[11] Patent Number: 4,850,692
[45] Date of Patent: Jul. 25, 1989

[54] SEMICONDUCTOR LIGHT POSITION DETECTOR FOR RANGEFINDER

[75] Inventors: Yoshiaki Hirao, Habikino; Ryuichiro Kuga, Katano; Hiroyuki Asakura, Osaka; Shusuke Ono, Takatsuki; Yoshitomi Nagaoka, Neyagawa; Shinji Hataji, Kadoma; Hiromichi Tanaka, Hirakata, all of Japan

[73] Assignee: Matsushita Electric Industrial Co., Ltd., Osaka, Japan

[21] Appl. No.: 876,203

[22] Filed: Jun. 19, 1986

[30] Foreign Application Priority Data

Jun. 27, 1985 [JP] Japan .................. 60-140819

[51] Int. Cl.$^4$ .............. G01C 3/00; H01J 40/14
[52] U.S. Cl. .................. 356/1; 354/403; 250/214 B; 250/237 R
[58] Field of Search .............. 356/1, 4; 354/403; 250/214 B, 201 PF, 237 R

[56] References Cited

U.S. PATENT DOCUMENTS

| 4,304,487 | 12/1981 | Odone et al. | 354/403 |
| 4,375,332 | 3/1983 | Yokota et al. | 356/1 |
| 4,436,418 | 3/1984 | Morino | 356/1 |
| 4,441,810 | 4/1984 | Momose et al. | 354/403 |
| 4,511,248 | 4/1985 | Abbas | 356/1 |
| 4,579,450 | 4/1986 | Nagaoka et al. | 354/403 |

FOREIGN PATENT DOCUMENTS

| 60-87576 | 5/1985 | Japan . | |
| 0155912 | 8/1985 | Japan | 356/1 |

OTHER PUBLICATIONS

"Semiconductor Position Detector and its Application", Electronic Material, Japan, Feb. 1980, pp. 119-124.

Primary Examiner—Stephen C. Buczinski
Assistant Examiner—Linda J. Wallace
Attorney, Agent, or Firm—Wenderoth, Lind & Ponack

[57] ABSTRACT

A semiconductor light position detector for a rangefinder which projects a light beam onto an object and receives a reflected light beam from the object to measure a distance to the object. A portion of the light-receiving surface of the detector on which the reflected beam will not form a light spot is partially covered with a member that blocks unwanted light. Thus, the malfunctions caused by the flare component of the light from the light projector and the malfunctions due to increases in the shot noise under a high illuminance are reduced greatly.

14 Claims, 3 Drawing Sheets

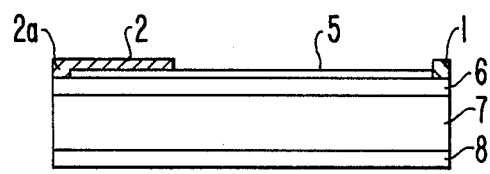
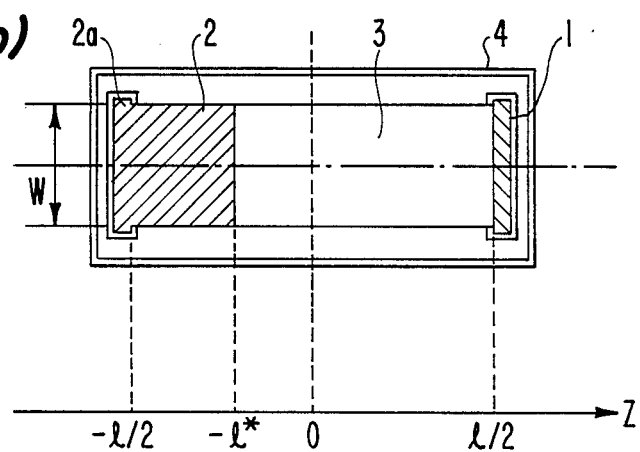

SEMICONDUCTOR LIGHT POSITION DETECTOR FOR RANGEFINDER

BACKGROUND OF THE INVENTION

1. Field of the Invention

The present invention relates to a rangefinder for automatically measuring a distance to an object, and more particularly to a semiconductor light position detector used in an automatic focusing device of a camera that automatically brings an object to be photographed into focus.

2. Description of the Prior Art

In order to automatically measure a distance to an object, several methods have already been proposed and put into practical use. Among them, a so-called light projection method has been recently used for the automatic focusing device or the like of a still camera or video camera, because it assures stable measurement of distance to a low contrast object and a dark object under poor illuminance. Specifically, a light beam such as an infrared light beam is projected onto an object, and a reflected light from the object is received as a light spot by a semiconductor position detector to determine the distance to the object.

An example of such a conventional light projection method is disclosed in Japanese Patent Application Laid-Open No. 60-87576, in which an infrared LED produces a light beam projected to an object for measuring a distance to such an object. A reflected light beam from the object is received by a semiconductor light position detector (hereinafter referred to as light position detector). The distance to the object is determined from a position of a light spot (more specifically centroid of luminance of the spot) formed by the reflected light beam on the surface of the detector.

A known device usually called a position sensitive device (PSD) is used as the light position detector for this method. The PSD consists essentially of a PIN photodiode having a high resistance layer on its surface. The structure of the PSD is described in detail in "Semiconductor Position Detector and its Application," in Electronic Material, Japan, Feb. 1980, pp. 119-124.

The aforementioned infrared LED projects a light beam having a light intensity distribution depending on the shape of its light-emitting portion onto an object to be photographed. A light spot also depending on the shape of the light-emitting portion is formed on the light-receiving surface of the light position detector. Referring to FIGS. 4(a)-(d), there are shown the optical position detector and the light spot produced when the infrared LED has a semispherical or circular light-emitting portion. A light position detector 9 has an effective light-receiving surface 10, and two aluminum electrodes 11 and 12 for taking out produced photocurrent. Ideally, as shown in FIG. 4(a), a light spot 13 reflecting the shape of the light-emitting portion of the infrared LED (not shown) is formed, and a light intensity distribution shown in FIG. 4(b) is obtained. In reality, however, the light spot formed on the light-receiving surface 10 may include a flare component 15 beside a main component 14 reflecting the shape of the light-emitting portion of the infrared LED, as shown in FIG. 4(c). The projected light from the LED is reflected from the inner wall of the housing can and the edge surface of the cover glass of the light projector, producing the flare component 15 usually assuming a circular distribution. As already mentioned, the rangefinder determines a distance from the position of the light spot. Accordingly, when the flare component 15 is large, for example when another object having a high reflectivity exists near the object of interest, the light intensity distribution on the light position detector has two peaks as shown in FIG. 4(d). In this case, the distance is determined from the spurious centroid of luminance of the spot, which is found from the weighted average of the main component 14 and the flare component 15. Thus, the measured distance involves an error.

Also in the arrangement described above, if the distance to the object is measured under a high illuminance, then a large amount of unwanted light enters the light position detector in addition to the infrared light used for measurement. This unwanted light produces unwanted photocurrent. As a result, a large quantity of shot noise is developed in proportion to the square root of the amount of the photocurrent. This is due to the fact that the light position detector responds considerably keenly to the wavelengths of the sunlight or of the light emitted by an illuminating halogen lamp. FIG. 5 shows a typical example 16 of the spectral sensitivity characteristic of the light position detector, the spectral characteristic 17 of the sunlight, and the spectral characteristic 18 of a halogen lamp at a temperature of 2200 K. Usually, the infrared light for measurement is modulated with a certain frequency $f_o$ to be discriminated from the unwanted light. The arithmetic unit for determining the distance incorporates a frequency-separating filter and a synchronous detector circuit to extract the component arising from the infrared light for measurement. However, when the amount of the unwanted light incident on the detector is quite large, those noise components of the unwanted light which approximate the certain frequency $f_o$ deteriorate the accuracy of the measurement. As a result, the hunting of the taking lens, a defocusing, or other malfunction will take place.

SUMMARY OF THE INVENTION

It is an object of the invention to provide a light position detector capable of reducing the error that is caused by the flare component and reducing malfunctions which are caused by a deterioration in signal-to-noise ratio (S/N) under a high illuminance.

The above object is achieved by a semiconductor light position detector according to the invention, in which a light-receiving surface of the detector is covered at a part on which a light spot of a light beam for measuring a distance will not be formed with a member that blocks light. This member is preferably fixed with respect to the light-receiving surface and may be able to block light having wavelengths exceeding 400 nm to which the detector responds.

The above-described structure according to the invention shields the light position detector from unwanted incident light to remove the influence of the flare component of the incident light, and to reduce the shot noise generated by the detector.

The member that shields the detector may be either electrically conductive or not. Since the light-receiving surface of the detector is coated with a protective film made of a transparent nonconductive material, the passage of the photocurrent used for the measurement of a distance is not affected by an electrically conductive shielding member.

The portion of the light-receiving surface which is not illuminated with the light beam plays an indispensable role for calculating the distance to the object. This is because the photocurrent produced at the position where the light spot is formed is distributed into two currents whose magnitudes are in inverse proportion to the distances from the light spot position to the electrodes at both ends, and because the distance to the object is determined from the ratio between the two currents.

BRIEF DESCRIPTION OF THE DRAWINGS

FIGS. 1(a) and (b) are side and plan views of a light position detector according to the present invention;

DESCRIPTION OF THE PREFERRED EMBODIMENTS

Figure 2:
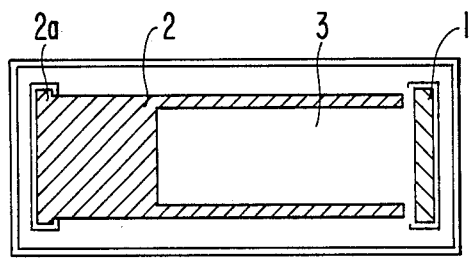
FIGS. 2 and 3 are plan views of other light position detectors according to the invention.

FIGS. 1(a) and (b) show a semiconductor light position detector as an embodiment of the present invention. A PIN photodiode is composed of a low-resistance N-type layer 8, a high-resistance intrinsic (I) layer 7 formed on the N-type layer 8, and a low-resistance P-type layer 6 formed on the I layer 7. A surface of the P-type layer 6 is the light-receiving surface. A transparent protective film 5 made of electrically nonconductive material is formed on the surface of the P-type layer 6 leaving margins at both ends of the surface for electrodes. On one end margin on the surface of the P-type layer 6 is formed a first electrode 1 made of aluminum. On the other end margin on the surface of the P-type layer 6 is formed a second electrode 2a made of aluminum. The second electrode 2a is fixed with respect to the light-receiving surface and is extended to cover a part of the protective film 5 to form a light-blocking member 2, the remaining (uncovered) part of the protective film 5 becoming an effective light-receiving surface 3. The area of the light-blocking member 2 is selected to block undesired light including the flare components but not to block the desired light spot for measuring the distance as will be described in detail later.

Although the light-blocking member 2 above the light-receiving surface of the PIN photodiode is made of aluminum, which is an electrically conductive substance, the path that the photocurrent flows is not changed and thus the measurement is not affected. This is because the light-blocking member 2 is electrically isolated from the PIN photodiode by the electrically nonconductive protective film 5.

The area of the light-blocking member 2 is important, and is determined by a moving range of the desired light spot on the light position detector as will be described below.

Figure 6:
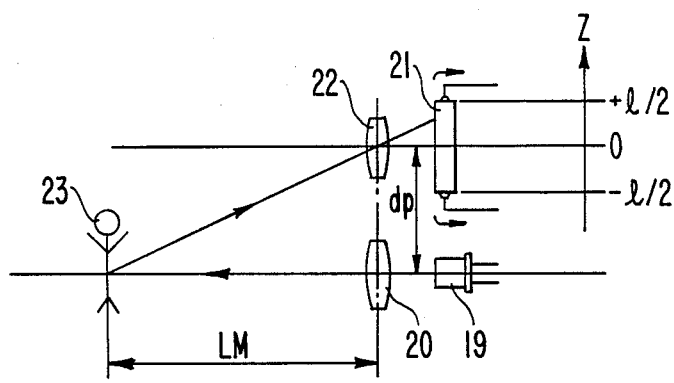
FIG. 6 is a diagram showing a prior art fundamental structure of a rangefinder in which the detector according to the invention is usable.

The fundamental structure of the rangefinder described in Japanese Patent Application Laid-Open No. 60-87576 is shown in FIG. 6. The structure has an infrared LED 19, a projector lens 20, a light position detector 21, and a light-receiving lens 22. The distance to an object 23 should be measured. Necessary parameters are as follows:

radius of the semispherical light-emitting portion of the infrared LED 19: $r_p$ range of distances to be measured: from $L_{near}$ to infinity focal length of the projector lens 20: $f_L$ focal length of the light-receiving lens 22: $f_p$ base line length, i.e., the distance between the projector lens and the light-receiving lens: $d_p$ effective length of the light-receiving surface of the detector 21: l width of the light-receiving surface of the detector 21: W When the object lies at an infinitely remote position, the position of the light spot, i.e., the centroid of luminance of the spot on the detector 21 of the rangefinder, theoretically lies at the center of the light-receiving surface (Z=0 in the coordinate system shown in FIG. 6 or FIG. 1(b)). When the object is $L_{near}$ distant from the rangefinder, the light spot lies at the position expressed as:

$$Z = f_p \cdot d_p / L_{near} \quad (1)$$

Thus the light spot is movable in a range from $$Z = 0 \text{ to } Z = f_p \cdot d_p / L_{near} \quad (2)$$

Taking into account the size of the light spot, the range in which the spot is movable lies in a range from $$Z = -r_p^* \text{ to } Z = r_p^* + f_p \cdot d_p / L_{near} \quad (3)$$

where $r_p^* = r_p \cdot (f_p / f_L)$ (4)

In the above formula, $r_p^*$ indicates the radius of the light spot on the detector 21. Accordingly, the position of the light-blocking member 2 is set outside the range given by formula (3).

Let us assume that the radius of the light-emitting portion of the infrared LED is 0.35 mm, the distance to be measured ranges from 1.2 m ($L_{near}$) to infinity, the focal length of each of the projector and the light-receiving lenses is 25 mm, the base line length $d_p$ is 40 mm, and the effective length l of the light-receiving surface of the detector 21 is 3 mm. The center point of light spot is formed at different points along the length of the light-receiving surface, each of the points corresponding to a different distance to the object whereby the center point, moves from Z=0 to Z=0.833 mm on the coordinate system defined in connection with FIG. 1(b). The light spot forms a circle having a radius of 0.35 mm if the projector and light-receiving lenses show no aberrations. At this time, the position at which the light spot is produced ranges from Z=−0.35 mm to Z=1.183 mm. In order to offer some allowance for the light-blocking member 2, the light-blocking member 2 is made to occupy the range Z<−0.65 mm. This is equivalent to l*=0.65 in FIG. 1(b). The light-blocking member 2 is formed when the aluminum electrode pattern is created during the semiconductor fabrication process for forming the light position detector 4.

As described thus far, in accordance with the present invention, the portion of the light-receiving surface of the light position detector on which the light spot will not be formed is covered by the aluminum film which is formed integrally with the electrodes during the fabrication process for forming the pattern of the aluminum electrodes. Thus, the malfunctions caused when the object is illuminated with intense light and the error in the measured distance produced by the flare component of the light from the infrared LED can be reduced greatly.

Figure 5:
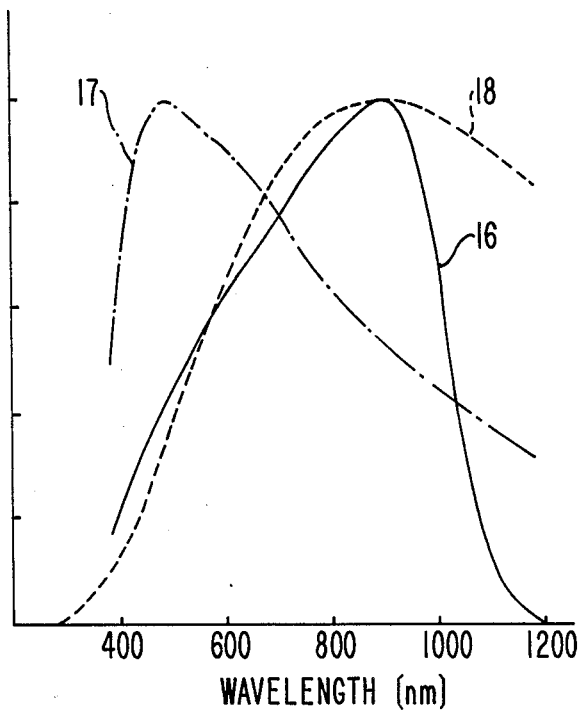
FIG. 5 is a diagram showing the prior art spectral sensitivity characteristic of a light position detector and spectral characteristics of the sunlight and of a halogen lamp.

In the present invention, it is not always necessary that the protective film 5 be transparent. The requirement is only that the film have a sufficient transmissivity for the wavelengths (FIG. 5) to which the position detector responds. Accordingly, it is possible to make the protective film 5 of a material that transmits light of wavelengths greater than 800 nm, for example.

It is also possible to replace the aluminum light-blocking member with another member such as metal foil or paint, that blocks light of wavelengths exceeding 400 nm.

Figure 3:
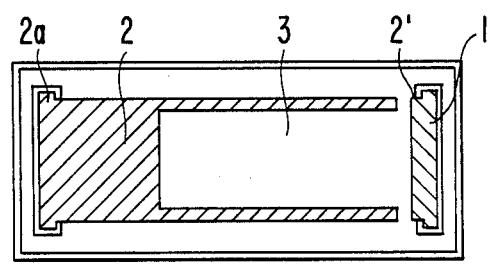
Figure 4A:
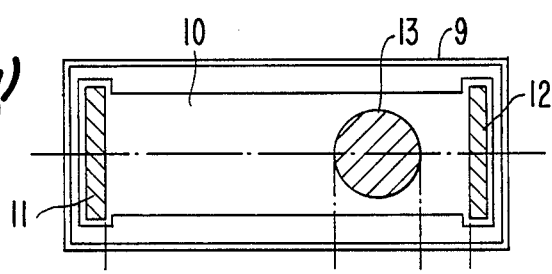
FIGS. 4(a)–(d) illustrate the prior art flare component of the light emitted by an infrared LED.
Figure 4B:
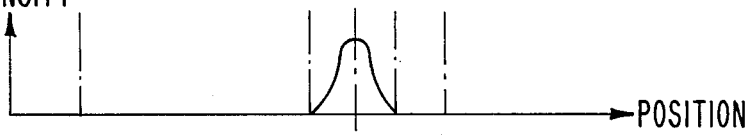
Figure 4C:
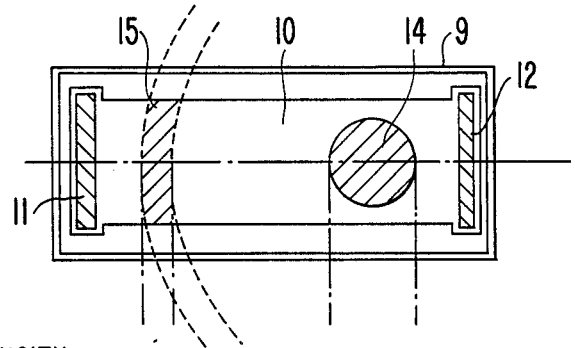
Figure 4D:
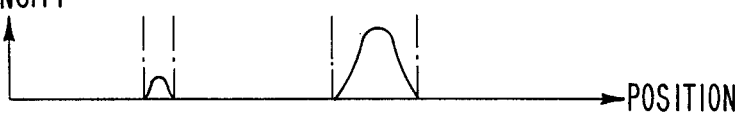

FIGS. 2 and 3 show other embodiments, respectively, of the invention. These embodiments are characterized in that the allowance offered in setting the light-blocking member is made less than the allowance in the first embodiment, provided that the size of the light spot is strictly determined and the position detector is strictly installed. Specifically, in the embodiment shown in FIG. 2, the light-blocking member 2 that is formed together with the second electrode 2a has an increased area and a less lateral allowance. In the embodiment shown in FIG. 3, a slight additional light-blocking member 2' is formed with the first electrode 1, where the area of the light-blocking member is $Z < -0.35$ mm and $Z > 1.183$ mm, and the width (W) of the effective light-receiving surface is $W > 0.70$ mm. In these embodiments, the area of the light-blocking member is increased. This considerably decreases the malfunctions caused by the flare component of the light from the light projector and the malfunctions induced by increases in the shot noise under a high illuminance, compared with the first embodiment, provided that the size of the light spot is accurately determined and the light position detector is accurately installed.

What is claimed is:

1. A semiconductor light position detector for a rangefinder which projects a light beam onto an object, receives a light beam reflected from the object, and calculates a distance to the object from a position of a light spot formed by the reflected light beam on a light-receiving surface of the detector, the position of the light spot being variable within an effective light-receiving area on the light-receiving surface according to the distance to the object with a center point of the light spot being formed at different points along a length of the light-receiving surface, each of the points corresponding to a different distance to the object, characterized in that a part of the light-receiving surface of the position detector is covered with a light-blocking member outside of the effective light-receiving area on which a light spot formed by the reflected beam will be formed.

2. The semiconductor light position detector as set forth in claim 1, wherein the light-receiving surface is covered with a protective film made of a nonconductive material except for electrode portions, and wherein the light-blocking member is formed on the protective film.

3. The semiconductor light position detector as set forth in claim 1, wherein the light-blocking member is a film made of aluminum.

4. The semiconductor light position detector as set forth in claim 2, wherein the light-blocking member is formed by extending electrodes of the detector.

5. The semiconductor light position detector as set forth in claim 1, wherein the light-blocking member blocks light having a wavelength longer than 400 nm.

6. A semiconductor light position detector for a rangefinder for measuring a distance to an object, comprising:
   a PIN photodiode having a light-receiving surface on which a reflected light beam from the object will form a light spot, the light spot being formed at a position which is variable within an effective light-receiving area on the light-receiving surface according to the distance to the object with a center point of the light spot being formed at different points along a length of the light-receiving surface, each of the points corresponding to a different distance to the object;
   electrodes formed on both ends of the light-receiving surface for taking out photocurrents produced by the PIN photodiode; and
   a light-blocking member formed on the light-receiving surface at a part outside of said effective light-receiving area.

7. The semiconductor light position detector as set forth in claim 6, further comprising a transparent protective film made of an electrically nonconductive material formed between the light-receiving surface and the light-blocking member.

8. The semiconductor light position detector as set forth in claim 7, wherein the light-blocking member is formed integrally with at least one of the electrodes.

9. The semiconductor light position detector as set forth in claim 6, wherein the light-blocking member blocks light having a wavelength longer than 400 nm.

10. A semiconductor light position detector for a rangefinder which projects a light beam onto an object, receives a light beam reflected from the object, and calculates a distance to the object from a position of a light spot formed by the reflected light beam on a light-receiving surface of the detector, the position of the light spot being variable within an effective light-receiving area on the light-receiving surface according to the distance to the object with a center point of the light spot being formed at different points along a length of the light-receiving surface, each of the points corresponding to a different distance to the object, characterized in that part of the light-receiving surface of the position detector is covered with a light-blocking member which is fixed with respect to the light-receiving surface, the blocking member covering only the part of the light-receiving surface outside of the effective light-receiving area.

11. The semiconductor light position detector as set forth in claim 10, wherein the light-receiving surface is covered with a protective film made of a nonconductive material except for electrode portions, and wherein the light-blocking member is formed on the protective film.

12. The semiconductor light position detector as set forth in claim 10, wherein the light-blocking member is a film made of aluminum.

13. The semiconductor light position detector as set forth in claim 11, wherein the light-blocking member is formed by extending electrodes of the detector.

14. The semiconductor light position detector as set forth in claim 10, wherein the light-blocking member blocks light having a wavelength longer than 400 nm.

* * * * *